(12) United States Patent
Seyama

(10) Patent No.: US 12,400,993 B2
(45) Date of Patent: Aug. 26, 2025

(54) SUBSTRATE HOLDER AND BONDING SYSTEM

(71) Applicant: SHINKAWA LTD., Tokyo (JP)

(72) Inventor: Kohei Seyama, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 146 days.

(21) Appl. No.: 18/021,807

(22) PCT Filed: Aug. 19, 2020

(86) PCT No.: PCT/JP2020/031226
§ 371 (c)(1),
(2) Date: Feb. 17, 2023

(87) PCT Pub. No.: WO2022/038700
PCT Pub. Date: Feb. 24, 2022

(65) Prior Publication Data
US 2024/0014167 A1  Jan. 11, 2024

(51) Int. Cl.
*B23K 3/00* (2006.01)
*B23K 1/00* (2006.01)
(Continued)

(52) U.S. Cl.
CPC ............ H01L 24/75 (2013.01); *B23K 1/0016* (2013.01); *B23K 3/087* (2013.01);
(Continued)

(58) Field of Classification Search
CPC . H01L 21/6838; B25J 15/0683; B23K 20/004
See application file for complete search history.

(56) References Cited

U.S. PATENT DOCUMENTS 5,307,978 A * 5/1994 Ricketson ......... H01L 21/67144
228/49.1
6,062,459 A * 5/2000 Sabyeying .............. H01L 24/78
269/903

(Continued)

FOREIGN PATENT DOCUMENTS

CN 111492724 8/2020
CN 113302725 8/2021
(Continued)

OTHER PUBLICATIONS

"Office Action of Korea Counterpart Application", issued on Mar. 22, 2024, with English translation thereof, p. 1-p. 28.
(Continued)

*Primary Examiner* — Erin B Saad
(74) *Attorney, Agent, or Firm* — JCIPRNET

(57) ABSTRACT

A bonding system (90) is provided with a bonding device (80) for bonding semiconductor chips (45) to individual substrates (41), and a substrate holder (10) for holding the individual substrates (41), the bonding device (80) being provided with a stage (31) for fixing, by suction, the substrate holder (10) on a placement surface (13a), the substrate holder (10) being provided with a plate-shaped base (11) and a positioning member (21) that is provided on the base (11) and that defines the position of the individual substrates (41), the base (11) having an upper surface (11a) on which the individual substrates (41) are placed and a lower surface (11b) that is fixed by suction onto the placement surface (31a).

8 Claims, 6 Drawing Sheets

(51) Int. Cl.
    *B23K 3/08*     (2006.01)
    *H01L 23/00*     (2006.01)
    *B23K 101/40*     (2006.01)

(52) U.S. Cl.
    CPC .................. *B23K 2101/40* (2018.08); *H01L 2224/75744* (2013.01); *H01L 2224/75755* (2013.01); *H01L 2224/7598* (2013.01); *H01L 2224/75984* (2013.01)

(56) References Cited

U.S. PATENT DOCUMENTS

| | | | | |
|---|---|---|---|---|
| 6,124,725 | A * | 9/2000 | Sato | G01R 31/2851 |
| | | | | 324/754.03 |
| 6,466,046 | B1 * | 10/2002 | Maruyama | H01L 21/6838 |
| | | | | 324/762.05 |
| 6,603,325 | B2 * | 8/2003 | Maruyama | H01L 21/68735 |
| | | | | 324/754.08 |
| 7,841,079 | B2 | 11/2010 | Inoue et al. | |
| 9,182,443 | B2 * | 11/2015 | Shaue | G01R 31/2601 |
| 9,381,577 | B2 * | 7/2016 | Iizuka | H01L 21/67288 |
| 10,090,186 | B2 * | 10/2018 | Togashi | H01L 21/67092 |
| 11,262,381 | B2 * | 3/2022 | Torreiter | G01R 31/2831 |
| 12,100,612 | B2 * | 9/2024 | Yoshii | H01L 21/6838 |
| 2002/0190741 | A1 * | 12/2002 | Maruyama | H01L 21/6838 |
| | | | | 324/750.14 |
| 2003/0197501 | A1 * | 10/2003 | Maruyama | G01R 31/2886 |
| | | | | 324/758.01 |
| 2004/0115981 | A1 * | 6/2004 | Wang | H01L 21/67333 |
| | | | | 439/342 |
| 2005/0269731 | A1 * | 12/2005 | Matsushita | B81C 1/00873 |
| | | | | 264/160 |
| 2006/0154386 | A1 * | 7/2006 | Cheng | G01R 1/045 |
| | | | | 438/15 |
| 2013/0153644 | A1 | 6/2013 | Hojo et al. | |
| 2014/0203829 | A1 * | 7/2014 | Yamada | G01R 1/0408 |
| | | | | 324/750.01 |
| 2015/0201537 | A9 * | 7/2015 | Eckert | H01L 24/75 |
| | | | | 29/740 |
| 2016/0029494 | A1 | 1/2016 | Hojo et al. | |
| 2020/0344889 | A1 | 10/2020 | Kondo | |
| 2021/0215738 | A1 * | 7/2021 | Torreiter | G01R 31/2831 |
| 2021/0225799 | A1 | 7/2021 | Seyama et al. | |
| 2021/0351057 | A1 | 11/2021 | Tamura | |
| 2022/0208571 | A1 * | 6/2022 | Gibbs | H01L 21/561 |
| 2023/0010049 | A1 * | 1/2023 | Vellanki | H01L 21/68757 |

FOREIGN PATENT DOCUMENTS

| | | |
|---|---|---|
| JP | H0621110 | 1/1994 |
| JP | H10189652 | 7/1998 |
| JP | 2000021932 | 1/2000 |
| JP | 2000049210 | 2/2000 |
| JP | 2003218593 | 7/2003 |
| JP | 2004165607 | 6/2004 |
| JP | 2004304168 | 10/2004 |
| JP | 2008288460 | 11/2008 |
| JP | 2008294033 | 12/2008 |
| JP | 2010171172 | 8/2010 |
| JP | 2011254032 | 12/2011 |

OTHER PUBLICATIONS

"International Search Report (Form PCT/ISA/210) of PCT/JP2020/031226", mailed on Oct. 27, 2020, with English translation thereof, pp. 1-4.

"Office Action of Taiwan Counterpart Application", issued on Jul. 13, 2022, with partial English translation thereof, p. 1- p. 11.

"Office Action of China Counterpart Application", issued on Jun. 16, 2025, with English translation thereof, p. 1-p. 32.

* cited by examiner

SUBSTRATE HOLDER AND BONDING SYSTEM

CROSS-REFERENCE TO RELATED APPLICATION

This application is a 371 application of the International PCT application serial no. PCT/JP2020/031226, filed on Aug. 19, 2020. The entirety of the above-mentioned patent application is hereby incorporated by reference herein and made a part of this specification.

TECHNICAL FIELD

The invention relates to a substrate holder holding individual substrates, a bonding system formed by the substrate holder and a bonding apparatus, and a bonding method in the bonding system.

RELATED ART

In bonding of semiconductor chips, semiconductor chips are often bonded in order onto respective bonding regions of a multi-chamfering substrate in which multiple bonding regions for bonding semiconductor chips are arranged. However, in the case where dicing cannot be carried out on the substrate after bonding, or in the case where the structure is complicated like a multi-layer printed substrate and the yield is poor, a method (see, for example, Patent Document 1) in which individual substrates are cut from the multi-chamfering substrate and placed and arranged on a palette to be conveyed to a stage of the bonding apparatus, the respective individual substrates are sucked and fixed on convex parts provided on the stage, and semiconductor chips are bonded in order thereupon.

Meanwhile, in recent years, gold solder fusion bonding (see, for example, Patent Document 2) in which gold bumps are formed on multiple electrodes of an electronic component, thin solder films are formed on the surfaces of multiple copper electrodes on a substrate, and the gold in the gold bumps and the solders on the surfaces of the copper electrodes are thermal fusion bonded at the same time is adopted.

PRIOR ART DOCUMENTS

Patent Documents

Patent Document 1: Japanese Laid-open No. 2000-21932
Patent Document 2: Japanese Laid-open No. 2011-254032

SUMMARY OF INVENTION

Technical Problem

However, in the case where gold solder fusion bonding is adopted in bonding a semiconductor chip to a substrate as disclosed in Patent Document 2, it is required to simultaneously apply heat and a pressing load to the semiconductor chip and the substrate. However, to avoid interference with the palette, the convex part of the stage of the bonding apparatus disclosed in Patent Document 1 is smaller than the size of the individual substrate, and the individual substrate is supported in a state in which a peripheral part extends outward from the convex part. In such case, as disclosed in FIG. 9 of Patent Document 1, there is no problem if the size of the semiconductor chip is smaller than the size of the convex part. However, in recent years, there are increasing demands for bonding a semiconductor chip whose size is substantially the same as an individual substrate onto the individual substrate.

At this time, in the bonding apparatus of Patent Document 1, since the individual substrate of the peripheral part is not supported by the convex part, the heat and the pressing load may not be able to be sufficiently applied to the semiconductor chip and the individual substrate of the peripheral part, and the semiconductor chip and the individual substrate may not be able to be stably bonded.

Therefore, an objective of the invention is to stably bond semiconductor chips onto individual substrates.

Solution to Problem

A substrate holder according to the invention holds an individual substrate to which a semiconductor chip is bonded. The substrate holder includes: a base, having a plate shape, wherein the individual substrate is placed on an upper surface of the base, and a lower surface of the base is sucked and fixed to a placement surface of a stage of a bonding apparatus; and a positioning member, provided on the base to define a position of the individual substrate placed on the upper surface of the base.

Accordingly, since the entire surface of the individual substrate is held on the upper surface of the base, a semiconductor chip whose size is substantially the same as the individual substrate can be stably bonded to the individual substrate.

In the substrate holder according to the invention, it may also be that in the base, a through hole penetrating in a thickness direction is provided in a region in which the individual substrate is placed, and the through hole is in communication with a suction hole provided in the stage of the bonding apparatus when the lower surface is sucked and fixed to the placement surface of the stage of the bonding apparatus.

Accordingly, the individual substrate can be sucked and fixed to the upper surface of the base sucked and fixed to the placement surface of the stage.

In the substrate holder according to the invention, it may also be that in the base, a plurality of individual substrates are placed on the upper surface, and a plurality of through holes penetrating in a thickness direction are respectively provided in respective regions in which the respective individual substrates are placed, the respective through holes are in communication with at least one suction hole provided in the stage of the bonding apparatus when the lower surface is sucked and fixed to the placement surface of the stage of the bonding apparatus.

Accordingly, the individual substrates can be simultaneously sucked and fixed to the upper surface of the base sucked and fixed to the placement surface of the stage.

In the substrate holder according to the invention, it may also be that in the base, a groove allowing the through holes to communicate with each other is provided on the lower surface.

Accordingly, the through holes can be made vacuum by using one suction hole provided on the stage to simultaneously suck and fix the respective individual substrates to the upper surface of the base.

In the substrate holder according to the invention, it may also be that in the base, an upper flatness value of the upper surface and a lower flatness value of the lower surface are equal to or less than a reference flatness value, and a thickness deviation is equal to or less than a reference deviation.

Accordingly, the flatness value of the upper surface when the base is sucked and fixed to the placement surface of the stage is equal to a placement flatness value of the placement surface of the stage, and the individual substrate can be held on the base at a levelness same as the case where the individual substrate is directly sucked and fixed to the placement surface of the stage.

In the substrate holder according to the invention, it may also be that the positioning member is a plate-shaped member in which at least one opening with which the individual substrate is fit is formed, and is superimposed on the base so that the opening forms a concave part defining a position at which the individual substrate is placed.

Accordingly, by configuring the positioning member, as a component different from the base, to be superimposed on the base, it is not required to perform processing for the concave part defining the position of the individual substrate in the base. Accordingly, the processing of the base can be simplified, and the flatness value of the base can be reduced.

In the substrate holder according to the invention, it may also be that the base is a ceramic member in which the upper surface and the lower surface are polished, and the positioning member is made of metal.

Accordingly, the flatness values of the upper surface and the lower surface of the base can be reduced, and the thickness deviation can be reduced. In addition, the positioning member not limited by flatness value is made by inexpensive metal. Accordingly, the cost can be reduced.

A bonding system according to the invention includes: a bonding apparatus, bonding a semiconductor chip to an individual substrate; and a substrate holder, holding the individual substrate. The bonding apparatus includes a stage for sucking and fixing the substrate holder on a placement surface. The substrate holder includes: a base, having a plate shape, wherein the individual substrate is placed on an upper surface of the base, and a lower surface of the base is sucked and fixed to the placement surface of the stage; and a positioning member, provided on the base to define a position of the individual substrate placed on the upper surface of the base.

In this way, since the entire surface of the individual substrate is held on the upper surface of the base, a semiconductor chip whose size is substantially the same as the individual substrate can be stably bonded to the individual substrate.

In the bonding system according to the invention, it may also be that the stage includes a suction hole, in the base, a through hole penetrating in a thickness direction is provided in a region in which the individual substrate is placed, and the through hole is in communication with the suction hole provided in the stage when the lower surface is sucked and fixed to the placement surface, and sucks and fixes the individual substrate to the upper surface of the base.

In this way, since the individual substrate can be sucked and fixed to the upper surface of the base sucked and fixed to the placement surface of the stage, a semiconductor chip whose size is substantially the same as the individual substrate can be stably bonded to the individual substrate.

In the bonding system according to the invention, it may also be that in the substrate holder, a plurality of individual substrates are placed on the upper surface, the positioning member respectively defines a position of each of the individual substrates placed on the upper surface of the base, the stage includes at least one suction hole, in the base, through holes penetrating in a thickness direction are respectively provided in respective regions in which the individual substrates are placed, and each of the through holes is in communication with at least one suction hole when the lower surface is sucked and fixed to the placement surface, and sucks and fixes each of the individual substrates to the upper surface of the base.

Accordingly, the individual substrates can be simultaneously sucked and fixed to the upper surface of the base sucked and fixed to the placement surface of the stage to effectively perform bonding.

In the bonding system according to the invention, it may also be that in the base, a groove allowing the through holes to communicate with each other is provided on the lower surface.

Accordingly, the through holes can be made vacuum by using one suction hole provided on the stage to simultaneously suck and fix the respective individual substrates to the upper surface of the base.

In the bonding system according to the invention, it may also be that in the base, an upper flatness value of the upper surface and a lower flatness value of the lower surface are equal to or less than a reference flatness value, and a thickness deviation is equal to or less than a reference deviation.

Accordingly, the individual substrate can be held on the base at a levelness same as the case where the individual substrate is directly sucked and fixed to the placement surface of the stage, and bonding can be performed stably.

In the bonding system according to the invention, it may also be that the positioning member is a plate-shaped member in which at least one opening with which the individual substrate is fit is formed, and is superimposed on the base so that the opening forms a concave part defining a position at which the individual substrate is placed.

In the bonding system according to the invention, it may also be that the base is a ceramic member in which the upper surface and the lower surface are polished, and the positioning member is made of metal.

A bonding method for bonding a semiconductor chip to an individual substrate according to the invention includes: a preparation step of preparing: a substrate holder, including: a base, wherein a plurality of individual substrates are placed on an upper surface of the base; and a positioning member, provided on the base to define a position of each of the individual substrates placed on the upper surface of the base, through holes penetrating in a thickness direction being respectively provided in respective regions in which the individual substrates are placed; and a bonding apparatus, including a stage having at least one suction hole, and pressing the semiconductor chip to the individual substrate to perform bonding; a placement step of placing the individual substrates on the placement surface of the substrate holder, and allowing each of the through holes to communicate with at least one of the suction hole to place the substrate holder on the placement surface of the stage; a sucking and fixing step, making the at least one of the suction hole of the bonding apparatus vacuum to suck and fix the substrate holder to the placement surface of the stage, and respectively sucking and fixing each of the individual substrates to the upper surface of the base; and a bonding process of bonding, in order, the semiconductor chip to the individual substrates.

Accordingly, a semiconductor chip whose size is substantially the same as the individual substrate can be stably bonded to the individual substrate.

In the bonding method according to the invention, it may also be that the bonding apparatus includes a placement station for placing the individual substrates on the placement surface of the substrate holder, and in the placement step, after the individual substrates are placed on the placement surface of the substrate holder by using the placement station, the substrate holder on which the individual substrates are placed are conveyed onto the stage, and the substrate holder that is conveyed is placed on the placement surface of the stage.

Since the individual substrates are conveyed by the substrate holder, bonding can be performed by adopting a simple method.

Effects of Invention

According to the invention, a semiconductor chip can be stably bonded onto an individual substrate.

DESCRIPTION OF EMBODIMENTS

Figure 1:
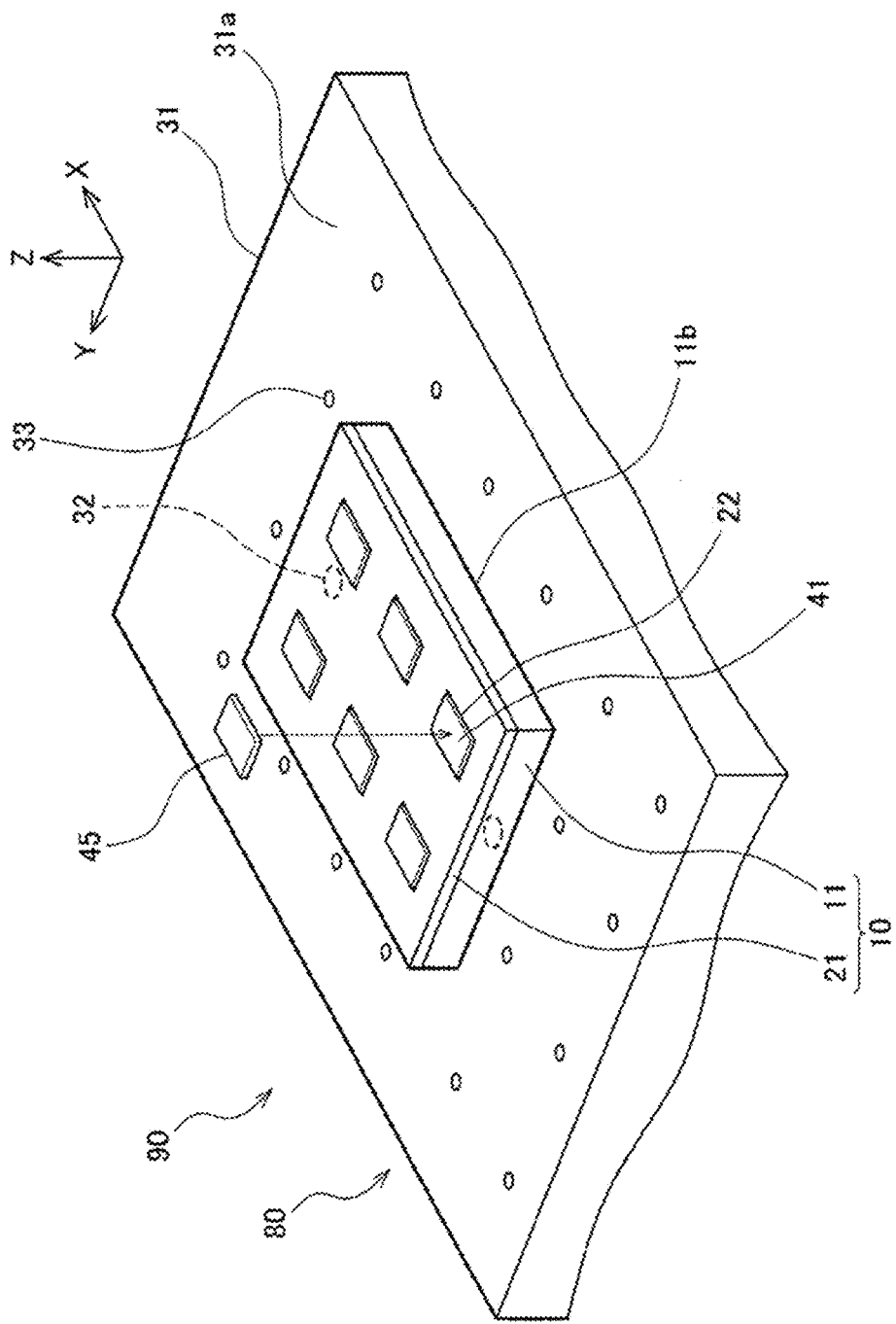
FIG. 1 is a perspective view illustrating a bonding system according to an embodiment.

In the following, a bonding system 90 according to an embodiment is described with reference to the drawings. As shown in FIG. 1, the bonding system 90 includes a bonding apparatus 80 bonding semiconductor chips 45 onto individual substrates 41 and a substrate holder 10 holding the individual substrates 41. In the following description, horizontal directions are set as X and Y directions, and the upper-lower direction is set as Z direction.

The bonding apparatus 80 includes a stage 31 which sucks and fixes the substrate holder 10. The upper surface of the stage 31 is a flat placement surface 31a. On the placement surface 31, multiple first suction holes 32 and multiple second suction holes 33 are provided. The first suction holes 32 and the second suction holes 33 are connected with a vacuum apparatus not shown herein, and suck and fix the substrate holder 10 on the placement surface 31a by using vacuum.

Figure 2:
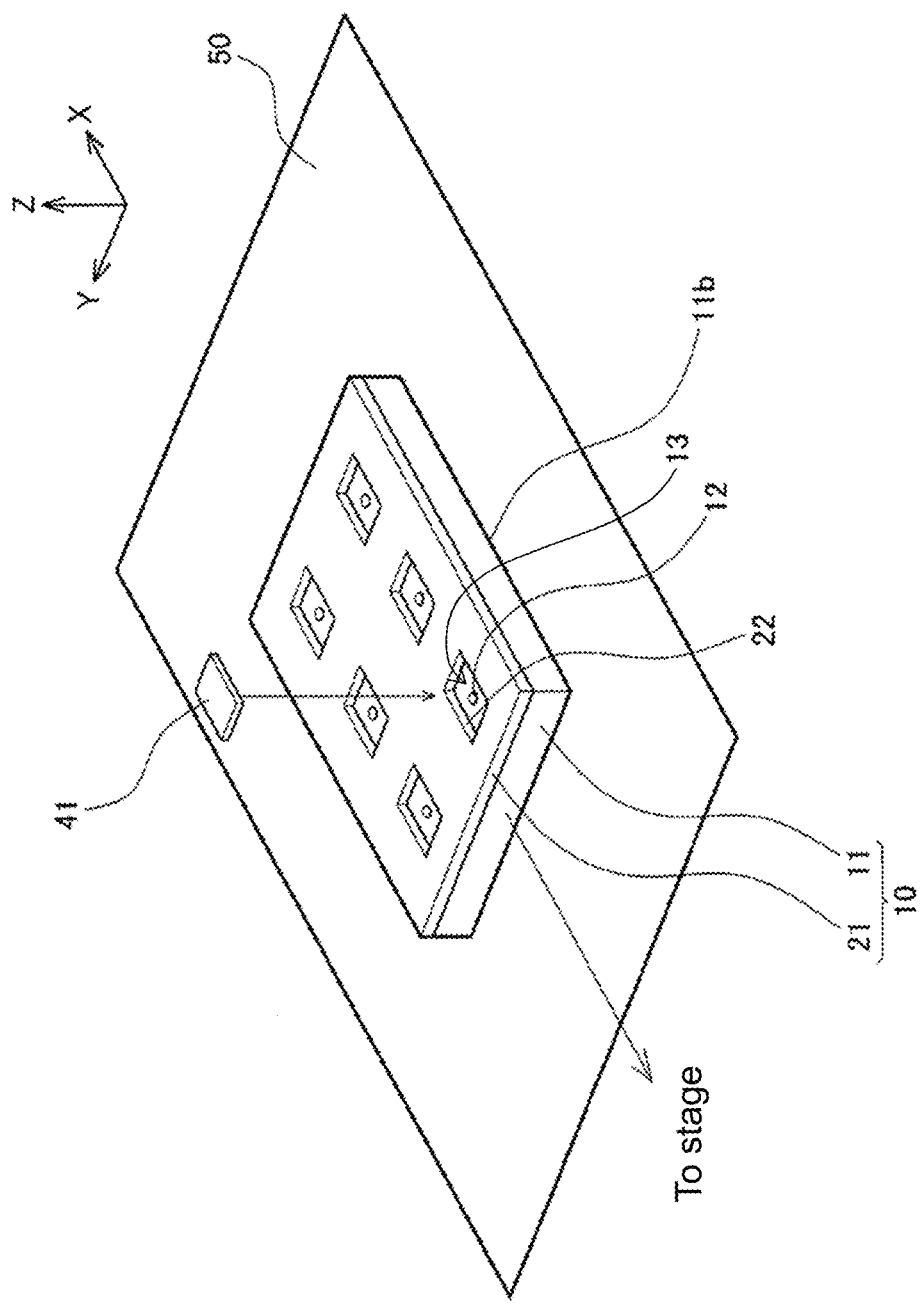
FIG. 2 is a perspective view illustrating a substrate holder of the bonding system shown in FIG. 1.
Figure 3:
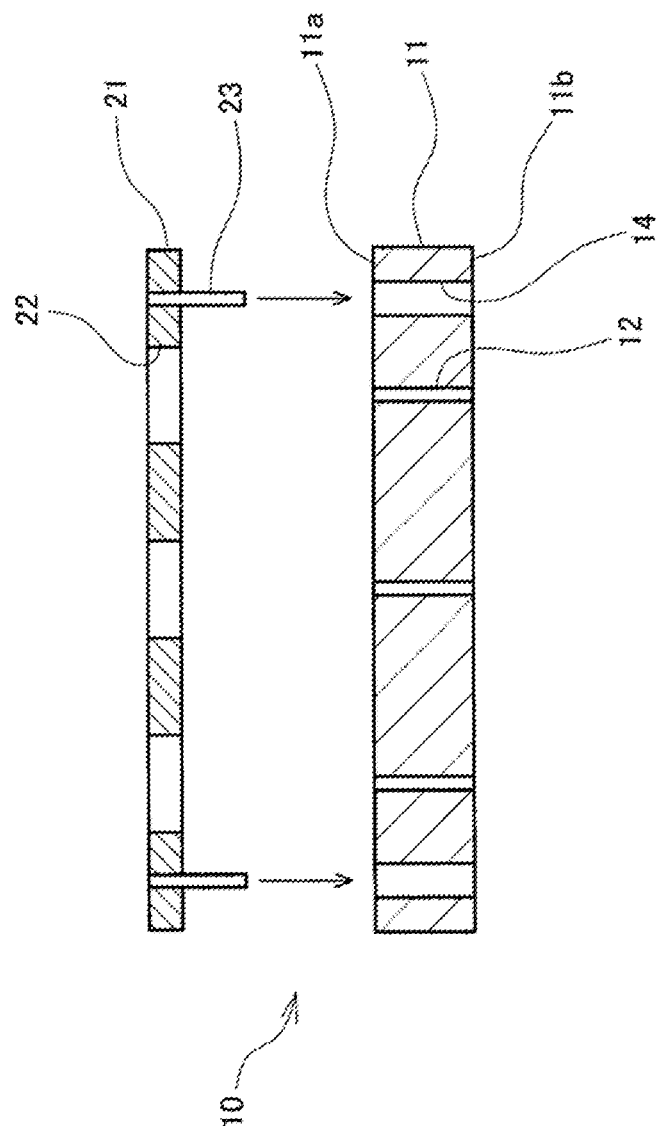
FIG. 3 is an exploded cross-sectional view of the substrate holder shown in FIG. 2.

As shown in FIGS. 2 and 3, the substrate holder 10 is configured by using a base 11 and a positioning member 21. The base 11 is a plate-shaped ceramic member in which the upper surface 11a and a lower surface 11b are polished. FIG. 2 illustrates a state in which the substrate holder 10 is set on a placement station 50 disposed in the vicinity of the bonding apparatus 80.

The positioning member 21 is a metal-made plate-shaped member formed with at least one opening 22 into which the individual substrate 41 is fit. As shown in FIG. 3, the positioning member 21 is superimposed onto the upper surface 11a of the base 11 by providing a pin 23 extending toward the base 11 and fitting the pin 23 into a hole 14 provided in the base 11. When the positioning member 21 is superimposed on the upper surface 11a of the base 11, as shown in FIG. 2, the opening 22 forms a concave part 13 defining the position at which the individual substrate 41 is placed. The concave part 13 partitions the region in which the individual substrate 41 is placed. It is noted that the hole 14 of the base 11 is larger than the pin 23 of the positioning member 21 so as to be able to absorb a thermal expansion difference between the base 11 and the positioning member 21.

Figure 4:
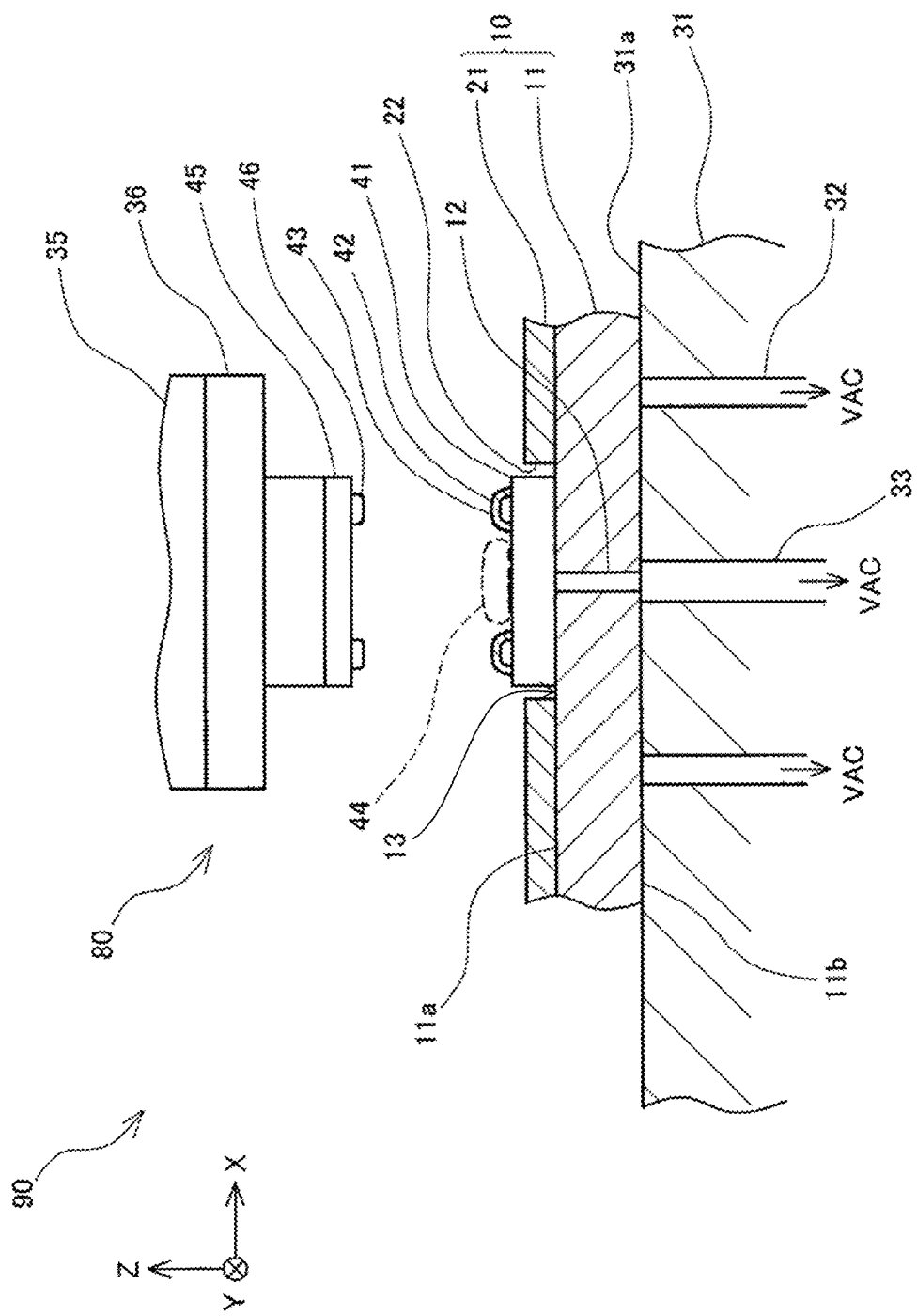
FIG. 4 is an elevation view illustrating a state in which a semiconductor chip is bonded to an individual substrate held in a concave part of the substrate holder of the bonding system according to the embodiment.

In the region of the concave part 13 of the base 11, a through hole 12 penetrating through the base 11 in the thickness direction is provided. As shown in FIG. 4, the through hole 12 is in communication with the second suction hole 33 provided on the placement surface 31a when the substrate holder 10 is placed on the placement surface 31a of the stage 31.

An upper flatness value of the upper surface 11a and a lower flatness value of the lower surface 11b of the base 11 are each equal to or less than a reference flatness value, and a thickness deviation of the base 11 is equal to or less than a reference deviation. Here, the flatness value is a value of an interval between two flat surfaces in the case where the interval between the two flat surfaces that are parallel is minimum when a planar body is sandwiched by two geometric flat surfaces of a given length that are parallel, and is represented by using an unit of interval value (mm) between two flat surfaces (μm)/predetermined distance (mm). The reference flatness value may be set freely, and may be set, for example, between 1 (μm)/100 (mm) and 10 (μm)/100 (mm). Also, the thickness deviation is a thickness variation degree in a predetermined range, and may be set between, for example, 1 (μm)/100 (mm) and 10 (μm)/100 (mm).

By defining the upper flatness value of the upper surface 11a and the lower flatness value of the lower surface 11b of the base 11 and the thickness deviation, the flatness value of the upper surface 11a is equal to a placement flatness value of the placement surface 31a of the stage 31 when the substrate holder 10 is sucked and fixed to the placement surface 31a of the stage 31. Therefore, the individual substrate 41 can be held on the base 11 at the same levelness as the case where the individual substrate 41 is directly sucked and fixed to the placement surface 31a of the stage 31.

A method for bonding the semiconductor chips 45 in substantially the same size as the individual substrates 41 onto the individual substrates 41 by using the bonding system 90 configured as the above is described in the following. Firstly, the bonding apparatus 80 and the substrate holder 10 are prepared (preparation step).

Firstly, as shown in FIG. 2, the substrate holder 10 is set to the placement station 50. Then, the individual substrates 41 are placed in the concave parts 13 of the substrate holder 10 by using a collet not shown herein. Solder layers 43 as shown in FIG. 4 are formed on an electrode 42 disposed on the upper surface of each individual substrate 41.

Once all the concave parts 13 are placed with the individual substrates 41, an underfill 44 is coated on the upper surfaces of the individual substrates 41, and, as shown in FIG. 4, the substrate holder 10 is placed on the placement surface 31a of the stage 31 of the bonding apparatus 80. At this time, the lower surface 11b of the base 11 of the substrate holder 10 covers the first suction holes 32 provided on the placement surface 31a, and the through holes 12 of the base 11 are in communication with the second suction holes 33 provided on the placement surface 31a (placement step).

When the first suction holes 32 and the second suction holes 33 are made vacuum by using a vacuum apparatus (not shown) of the bonding apparatus 80, the lower surface 11b of the base 11 is sucked and held on the placement surface 31a. In addition, when the second suction holes 33 are made vacuum, the through holes 12 of the base 11 in communication with the second suction holes 33 are also made vacuum. Accordingly, regarding the individual substrates 41 placed in the concave parts 13 of the base 11, the entire surfaces are sucked and held on the upper surface 11a of the base 11 in the regions of the concave parts 13.

Figure 5:
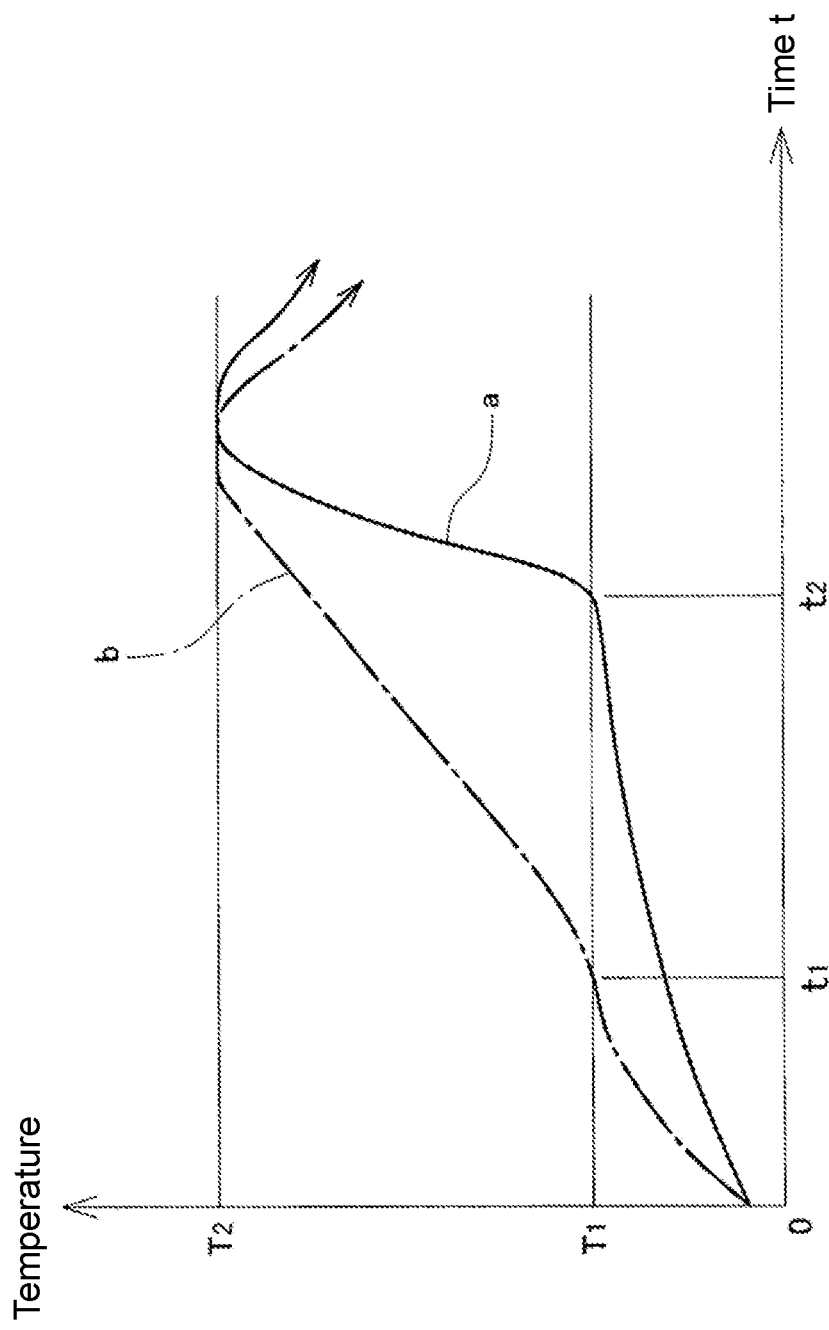
FIG. 5 is a diagram illustrating a change of temperature of an individual substrate over time when a semiconductor chip is bonded to the individual substrate by using the bonding system shown in FIG. 1.

The bonding apparatus 80 heats the stage 31 by using a heater built in the stage 31, and, as shown in FIG. 5, the temperature of the individual substrates 41 rises to a bonding start temperature T1. Here, a solid line a of FIG. 5 indicates a temperature change of the individual substrate 41 in the case where the base 11 is formed by using a ceramic material with low thermal conductivity, and a dot-chain line b of FIG. 5 illustrates a temperature change of the individual substrate 41 in the case where the base 11 is formed by a ceramic material with thermal conductivity higher than the case of the solid line a. Details regarding the solid line a and the dot-chain line b of FIG. 5 will be described subsequently.

Meanwhile, the bonding apparatus 80 sucks and holds the semiconductor chip 45 at the tip of a bonding tool 36 installed to the tip of a bonding head 35, and moves to right above the individual substrate 41. Gold bumps 46 are formed on an electrode of the semiconductor chip 45. A heater for heating the semiconductor chip 45 is built in the bonding head 35.

Once the temperature of the individual substrate 41 rises to the bonding start temperature T1, the bonding apparatus 80 rises the temperature of the semiconductor chip 45 by using the heater built in the bonding head 35, and lowers the bonding head 35 to press the gold bumps 46 of the semiconductor chip 45 against the solder layers 43 on the electrode 42 of the individual substrate 41. Then, as shown in FIG. 5, the bonding apparatus 80 rises the temperatures of the semiconductor chip 45 and the individual substrate 41 to a bonding temperature T2 equal to or higher than a solder melting temperature to thermal fusion bond the gold of the gold bumps 46 and the solder layers 43 simultaneously, thereby performing gold solder fusion bonding. In addition, the melt underfill 44 is filled between the upper surface of the individual substrate 41 and the lower surface of the semiconductor chip 45.

Then, the bonding apparatus 80 conduct air into a cooling path built in the bonding head 35 to lower the temperatures of the semiconductor chip 45 and the individual substrate 41 to cure the melt metal. At this time, the underfill 44 between the upper surface of the individual substrate 41 and the lower surface of the semiconductor chip 45 is cured. Accordingly, the bonding is ended (bonding step).

According to the above, in the bonding system 90 according to the embodiment, the entire surfaces of the individual substrates 41 are held by the upper surface 11a of the base 11 in the regions of the concave parts 13, and are sucked and fixed to the upper surface 11a by using the through holes 12. Therefore, even if the size of the semiconductor chip 45 and the size of the individual substrate 41 are substantially the same, heat and a pressing load can be sufficiently applied to the individual substrate 41 and the semiconductor chip 45, and the semiconductor chip 45 can be stably bonded to the individual substrate 41.

In addition, in the base 11, since the upper flatness value of the upper surface 11a and the lower flatness value of the lower surface 11b as well as the thickness deviation are defined, the individual substrates 41 can be held on the base 11 at the same levelness as the case where the individual substrates 41 are directly sucked and fixed to the placement surface 31a of the stage 31. Accordingly, the gold bumps 46 of the semiconductor chip 45 can be uniformly pressed onto the solder layers 43, and favorable gold solder fusion bonding can be performed. In particular, even if the thickness of the solder layer 43 is as thin as 10 μm, favorable gold solder fusion bonding can still be performed.

Moreover, the substrate holder 10 has a configuration in which the positioning member 21 made of metal is superimposed onto the base 11 as a plate-shaped ceramic member in which the upper surface 11a and the lower surface 11b are polished. Therefore, the flatness values and the thickness deviation of the base 11 can be reduced, and the positioning member 21 not limited by the flatness value is made by inexpensive metal. Accordingly, the cost can be reduced.

In the following, the solid line a and the dot-chain line b of FIG. 5 are described. In ceramic materials, there are ceramic materials with low thermal conductivity as well as ceramic materials with higher thermal conductivity. As described above, the solid line a of FIG. 5 indicates the temperature change of the individual substrate 41 in the case where the base 11 is formed by using a ceramic material with low thermal conductivity, and the dot-chain line b of FIG. 5 illustrates the temperature change of the individual substrate 41 in the case where the base 11 is formed by a ceramic material with thermal conductivity higher than the case of the solid line a.

As indicated by the solid line a of FIG. 5, in the case of the ceramic material with low thermal conductivity, even if the individual substrate 41 is heated by the heater of the stage 31, the speed that the heat from the stage 31 is transmitted to the individual substrate 41 is slow, and it takes time for the temperature of the individual substrate 41 to reach the bonding start temperature T1. However, when the semiconductor chip 45 is heated by the heater built in the bonding head 31 and the heat from the semiconductor chip 45 is transmitted to the individual substrate 41, since the heat does not escape from the individual substrate 41 to the stage 31, the time during which the temperature rises from the bonding start temperature T1 to the bonding temperature T2 is reduced.

Comparatively, when the base 11 is formed by using a ceramic material with thermal conductivity higher than the above, the heat transmission speed from the stage 31 to the individual substrate 41 is high, and, as indicated by the dot-chain line b, the time for reaching the bonding start temperature T1 is shorter than the case of the solid line a. Meanwhile, since the heat escaping from the base 11 to the stage 31 in the heat flowing from the semiconductor chip 45 to the individual substrate 41 is increased, the time during which the temperature rises from the bonding start temperature T1 to the bonding temperature T2 is longer than the case indicated by the solid line a.

Therefore, by preparing multiple types of the substrate holder 10 in which the thermal conductivity of the ceramic materials forming the base 11 is properly chosen, bonding matching the properties of the individual substrate 41 or the semiconductor chip 45 can be performed simply by replacing the substrate holder 10.

In the following, the configuration of a substrate holder 100 according to another embodiment is described with reference to FIG. 6. The substrate holder 100 is configured by using a base 111 and a positioning member 121. The positioning member 121 is a metal-made plate-shaped member formed with multiple openings 122 into which the individual substrates 41 are fit. Pins 124 protruding downward are provided at two ends of the positioning member 121. The pins 124 are engaged with the outer surface of the base 111 to define the position of the positioning member 121 with respect to the base 111.

In multiple regions of the base 111 in which the individual substrates 41 are placed, through holes 112 respectively penetrating through an upper surface 111a and a lower surface 111b are provided. A groove 115 allowing the through holes 112 to laterally communicate are provided on the lower surface 111b.

Figure 6:
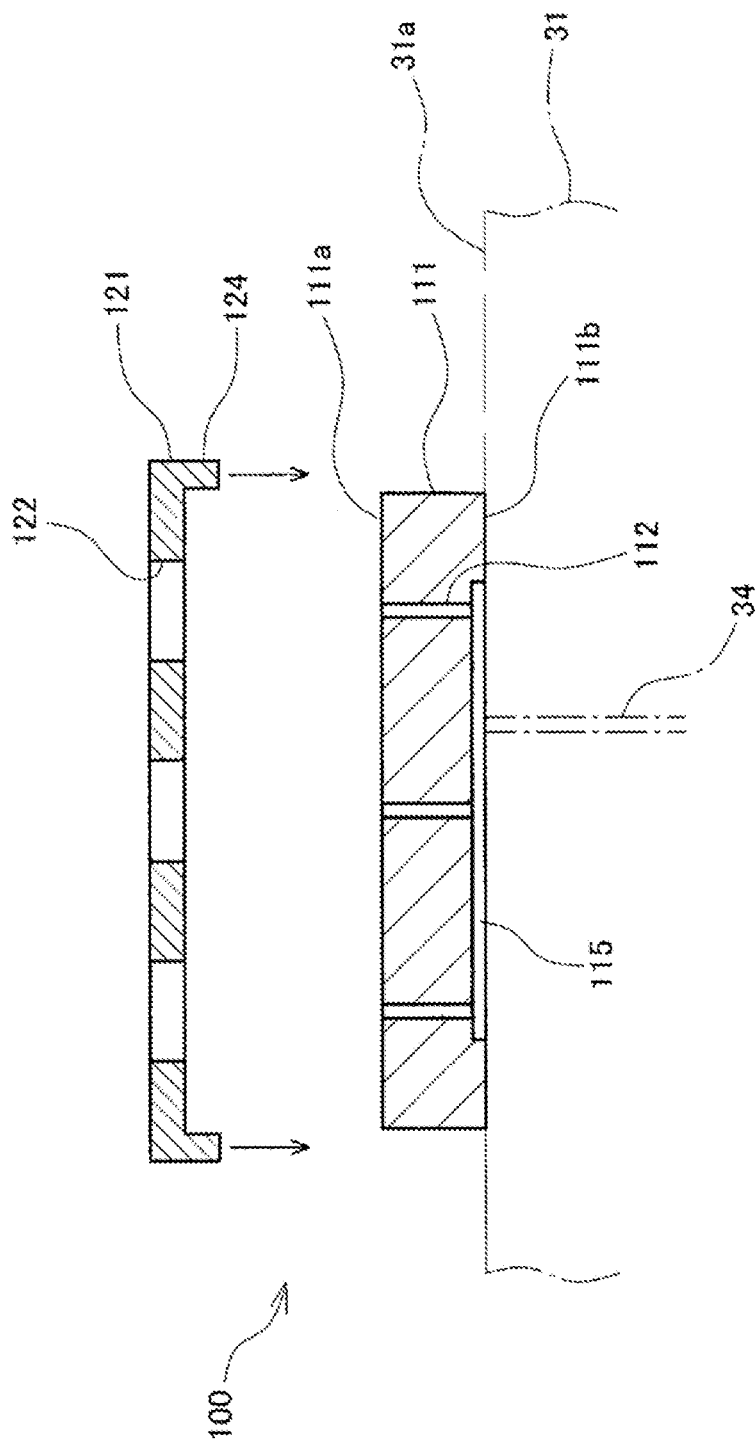
FIG. 6 is an exploded cross-sectional view of another substrate holder.

As shown in FIG. 6, when the substrate holder 100 is placed on the stage 31, so that the groove 115 of the substrate holder 100 covers a common suction hole 34 provided on the placement surface 31a of the stage 31, and the common suction hole 34 is made vacuum, the respective through holes 112 become vacuum, and the base 111 can be sucked and held on the placement surface 31a of the stage 31 at the same time when the individual substrates 41 are sucked and fixed on the upper surface 111a of the base 111.

With such configuration, even in the case where the number of the common suction hole 34 provided on the placement surface 31a of the stage 31 is limited or the case where the positions between the through holes 12 of the base 11 and the second suction holes 33 do not match as shown in FIG. 4, the base 111 and the individual substrates 41 can be sucked and fixed simultaneously. Here, it suffices as long as at least one common suction hole 34 is provided on the placement surface 31a of the stage 31, and one or multiple suction holes 34 may be provided.

What is claimed is:

1. A substrate holder, holding an individual substrate to which a semiconductor chip is bonded, the substrate holder comprising:
   a base, having a plate shape, wherein the individual substrate is placed on an upper surface of the base, and a lower surface of the base is sucked and fixed to a placement surface of a stage of a bonding apparatus; and
   a positioning member, provided on the base to define a position of the individual substrate placed on the upper surface of the base,
   wherein the upper surface of the base is a flat surface,
   the positioning member is a plate-shaped member formed with at least one opening with which the individual substrate is fit, and is superimposed on the upper surface of the base so that the at least one opening forms a concave part defining a position at which the individual substrate is placed,
   wherein on the base, a plurality of the individual substrates is placed on the upper surface, and a plurality of through holes penetrating in a thickness direction are respectively provided in respective regions in which the respective individual substrates are placed,
   wherein the respective through holes are in communication with at least one suction hole provided in the stage of the bonding apparatus when the lower surface is sucked and fixed to the placement surface of the stage of the bonding apparatus.

2. The substrate holder as claimed in claim 1, wherein in the base, a groove allowing the through holes to communicate with each other is provided on the lower surface.

3. A bonding system, comprising:
   a bonding apparatus, bonding a semiconductor chip to an individual substrate; and
   a substrate holder according to claim 1, holding the individual substrate,
   wherein the bonding apparatus comprises a stage for sucking and fixing the substrate holder on a placement surface, and
   the substrate holder comprises:
   a base, having a plate shape, wherein the individual substrate is placed on an upper surface of the base, and a lower surface of the base is sucked and fixed to the placement surface of the stage; and
   a positioning member, provided on the base to define a position of the individual substrate placed on the upper surface of the base,
   wherein the upper surface of the base is a flat surface,
   the positioning member is a plate-shaped member formed with at least one opening with which the individual substrate is fit, and is superimposed on the upper surface of the base so that the opening forms a concave part defining a position at which the individual substrate is placed,
   wherein in the substrate holder, a plurality of individual substrates are placed on the upper surface,
   the positioning member respectively defines a position of each of the individual substrates placed on the upper surface of the base,
   the stage comprises at least one suction hole,
   in the base, through holes penetrating in a thickness direction are respectively provided in respective regions in which the individual substrates are placed, and
   each of the through holes is in communication with at least one suction hole when the lower surface is sucked and fixed to the placement surface, and sucks and fixes each of the individual substrates to the upper surface of the base.

4. The bonding system as claimed in claim 3, wherein in the base, a groove allowing the through holes to communicate with each other is provided on the lower surface.

5. The substrate holder as claimed in claim 1, wherein on the base, an upper flatness value of the upper surface and a lower flatness value of the lower surface are equal to or less than a reference flatness value, and a thickness deviation is equal to or less than a reference deviation.

6. The substrate holder as claimed in claim 1, wherein the base is a ceramic member in which the upper surface and the lower surface are polished, and the positioning member is made of metal.

7. The bonding system as claimed in claim 3, wherein in the base, an upper flatness value of the upper surface and a lower flatness value of the lower surface are equal to or less than a reference flatness value, and a thickness deviation is equal to or less than a reference deviation.

8. The bonding system as claimed in claim 3, wherein the base is a ceramic member in which the upper surface and the lower surface are polished, and the positioning member is made of metal.

* * * * *